United States Patent
Clevenger et al.

[11] Patent Number: 6,057,236
[45] Date of Patent: May 2, 2000

[54] CVD/PVD METHOD OF FILLING STRUCTURES USING DISCONTINUOUS CVD AL LINER

[75] Inventors: Larry Clevenger, LaGrangeville; Mark Hoinkis, Fishkill; Roy C. Iggulden, Newburgh; Stefan J. Weber, Fishkill, all of N.Y.

[73] Assignee: International Business Machines Corporation, Armonk, N.Y.

[21] Appl. No.: 09/105,644

[22] Filed: Jun. 26, 1998

[51] Int. Cl.⁷ .................................................. H01L 21/44
[52] U.S. Cl. ............................................ 438/680; 438/672
[58] Field of Search .................................. 438/680, 672, 438/688

[56] References Cited

U.S. PATENT DOCUMENTS

| | | | |
|---|---|---|---|
| 4,404,235 | 9/1983 | Tarng et al. | 427/89 |
| 5,147,819 | 9/1992 | Yu et al. | 437/173 |
| 5,169,803 | 12/1992 | Miyakawa | 437/197 |
| 5,250,465 | 10/1993 | Iizuka et al. | 437/173 |
| 5,429,991 | 7/1995 | Iwasaki et al. | 437/192 |
| 5,702,983 | 12/1997 | Shinohara | 437/195 |
| 5,719,083 | 2/1998 | Komatsu | 438/652 |
| 5,730,835 | 3/1998 | Roberts et al. | 156/656.1 |

FOREIGN PATENT DOCUMENTS

| | | |
|---|---|---|
| 0776037 | 5/1997 | European Pat. Off. . |
| 776 037 A2 | 5/1997 | European Pat. Off. . |

Primary Examiner—Charles Bowers
Assistant Examiner—Martin Sulsky
Attorney, Agent, or Firm—Steven Capella

[57] ABSTRACT

Improved methods for forming metal-filled structures in openings on substrates for integrated circuit devices are obtained by the formation of a discontinuous metal liner by CVD in an opening to be filled. The discontinuous metal liner surprisingly provides wetting equivalent to or better than continuous layer CVD liners. The CVD step is followed by depositing a further amount of metal by physical vapor deposition over the discontinuous layer in the opening, and reflowing the further amount of metal to obtain the metal-filled structure.

The interior surface of the opening is preferably a conductive material such as titanium nitride. Preferably, the discontinuous metal layer is made of aluminum. The metal deposited by PVD is preferably aluminum or an aluminum alloy. The methods of the invention are especially useful for the filling of contact holes, damascene trenches and dual damascene trenches. The methods of the invention are especially useful for filling structures having an opening width less than 250 nm.

13 Claims, 2 Drawing Sheets

CVD/PVD METHOD OF FILLING STRUCTURES USING DISCONTINUOUS CVD AL LINER

BACKGROUND OF THE INVENTION

In the fabrication of integrated circuit devices, often there is a need to form conductive metal structures by filling trenches, holes or other openings in a substrate (or in layers of the substrate). In addition to traditional filled structures such as vias and contact holes, the filling processes are becoming more widely used with the wider use of damascene techniques for forming conductive structures such as metal wiring lines and dual damascene techniques which can be used to form compound conductive structures.

Most techniques for filling openings in substrates involve the use of chemical vapor deposition (CVD) and/or physical vapor deposition (PVD) of the desired metals in an opening which has been lined with a conductive barrier layer such as TiN. In many instances, these metal deposition techniques are supplemented with reflow techniques whereby deposited metal is heated to cause flow of the metal into voids remaining in the structure and/or to give the deposited metal a more planar profile. In some instances, additional steps such as etching may be used between deposition steps to access voids which are otherwise sealed off. In general, it is desired to reduce or eliminate the occurrence of voids in the filled structure, to minimize the number of steps needed to obtain the desired filled structure, to minimize the process temperature needed to achieve the filled structure, etc.

With the continued shrinking of integrated circuit device dimensions, the challenge of adequately filling the openings to form the desired conductive structures becomes greater. The challenge is typically greatest where the structure to be filled has a narrow opening and a high aspect ratio (ratio of depth to opening width). One approach to improved structure filling has been a two step process involving the formation of a continuous conformal CVD metal layer in the opening to be filled followed by deposition and reflow of a PVD metal layer. This technique is generally described in published European Patent Application No. 0 776 037, the disclosure of which is incorporated herein by reference.

While the above CVD/PVD technique provides good filling for many structures, there remains a concern regarding structures having less than 250 nm opening width since CVD processes tend to cause a closing off at the top of the opening. In addition to this concern, there is a continuing desire for further improved techniques which provide the ability to fill structures having high aspect ratios in an economical and reliable manner.

SUMMARY OF THE INVENTION

The invention provides improved methods for forming metal-filled structures in openings on substrates for integrated circuit devices. The methods of the invention are generally characterized by the formation of a discontinuous metal liner by CVD in an opening to be filled. The discontinuous metal liner surprisingly provides wetting equivalent to or better than continuous layer CVD liners. The methods of the invention thus enable filling of structures having opening widths well below 250 nm.

In one aspect, the invention encompasses a method forming a metal-filled structure in an opening on a substrate, the method comprising:
(a) providing a substrate having an opening with an interior surface,
(b) depositing a discontinuous metal layer by chemical vapor deposition on the interior surface of the opening,
(c) depositing a further amount of metal by physical vapor deposition over the discontinuous layer in the opening, and
(d) reflowing the further amount of metal to obtain the metal-filled structure.

The interior surface of the opening is preferably a conductive material such as titanium nitride. Preferably, the discontinuous metal layer is made of aluminum. The metal deposited by PVD is preferably aluminum or an aluminum alloy. The methods of the invention are especially useful for the filling of contact holes, damascene trenches and dual damascene trenches. The methods of the invention are especially useful for filling structures having an opening width less than 250 nm.

These and other aspects of the invention are discussed in further detail below.

DETAILED DESCRIPTION OF THE INVENTION

Figure 1:
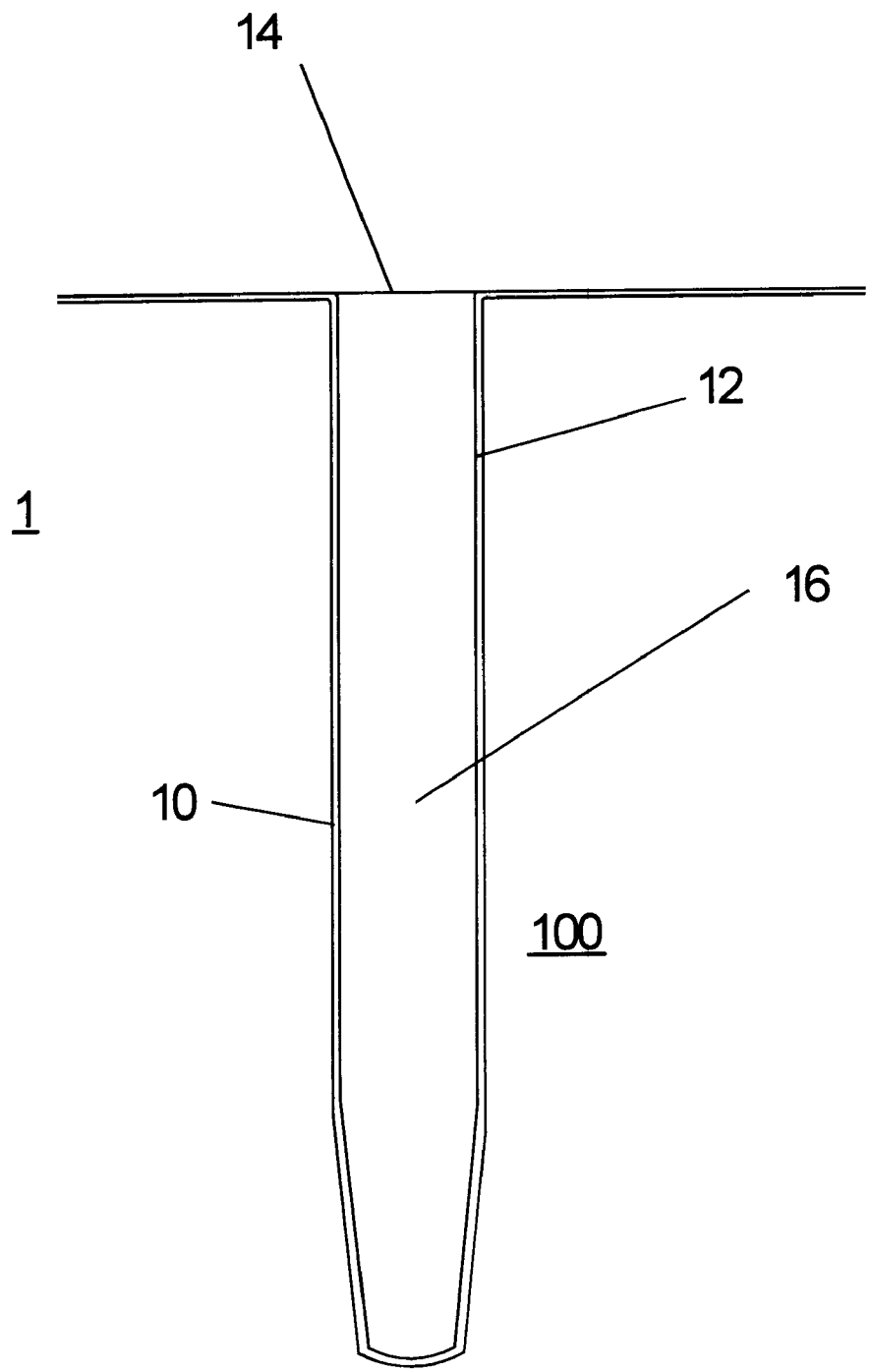
FIG. 1 is a schematic cross section of a substrate showing an interior surface of an unfilled opening with a TiN liner.

The invention provides improved methods for forming metal-filled structures in openings on substrates for integrated circuit devices. The methods of the invention are generally characterized by the formation of a discontinuous metal liner by CVD in an opening to be filled. The discontinuous metal liner surprisingly provides wetting equivalent to or better than continuous layer CVD liners. The methods of the invention thus enable filling of structures having opening widths well below 250 nm.

The methods of the invention generally comprise:
(a) providing a substrate having an opening with an interior surface,
(b) depositing a discontinuous metal layer by chemical vapor deposition on the interior surface of the opening,
(c) depositing a further amount of metal by physical vapor deposition over the discontinuous layer in the opening, and
(d) reflowing the further amount of metal to obtain the metal-filled structure.

The substrate provided in step (a) contains at least one and more preferably a plurality of openings. The openings may be those commonly made in the manufacture of integrated circuit devices for vias, contact openings, damascene and dual damascene trenches etc. These various openings may be formed by techniques known in the art or techniques to be developed. Typically, the openings are formed in dielectric layers which have been deposited on a (semiconductor) substrate. The openings are typically formed by lithographically patterning a mask on the surface of the top dielectric layer followed by one or more etching steps to create openings in the dielectric layer(s) corresponding to the openings of the mask. Examples of various techniques for forming openings are discussed in "Fundamentals of Semiconductor Processing Technologies" by Badih El-Kareh, Kluwer Academic Publishers, (1995), the disclosure of which is incorporated herein by reference. The substrate of the invention is preferably a semiconductor substrate such as would be used in the manufacture of integrated circuit chips. Silicon is the preferred substrate material. The dielectric layer(s) in which the openings are formed may be any conventional dielectric material used in integrated circuit manufacture. The openings in the substrate may be of any dimension corresponding to the desired conductive structure. The methods of the invention are especially useful where the opening to be filled has a width of about 250 nm or less, and especially about 200 nm or less.

The interior surface of the opening is preferably lined with a Group 4B–6B transition metal-containing conductive material. Preferred Group 4B–6B transition metal-containing conductive materials contain Group 4B–6B transition metals selected from the group consisting of titanium, tantalum or niobium. Preferably, the Group 4B–6B transition metal-containing conductive material is a Group 4B–6B transition metal nitride, titanium nitride being most preferred. The Group 4B–6B transition metal-containing conductive liner preferably prevents or minimizes unwanted interactions (e.g., diffusion) between the metal structure formed in the opening and the dielectric material surrounding the opening. The Group 4B–6B transition metal-containing conductive liner may also enhance the general integrity of the metal structure formed in the opening. The Group 4B–6B transition metal-containing conductive liner may be formed by CVD or other suitable technique known in the art. The thickness of the Group 4B–6B transition metal-containing liner may be varied depending on the width of the opening to be filled, the barrier capabilities of the selected liner material, etc. In general, it is preferred to minimize the thickness of the Group 4B–6B transition metal-containing liner. In some instances, the liner may be formed of plural layers (e.g., a layer of Ti and a layer of TiN).

The discontinuous metal layer is preferably made of aluminum. The discontinuous metal layer is preferably deposited by CVD. The deposition preferably uses known CVD techniques which are stopped before the formation of a continuous conformal film is achieved. Thus, the appearance of the discontinuous layer preferably is that of metal nuclei residing on the Group 4B–6B transition metal-containing liner on the interior surface of the opening to be filled. The discontinuous layer is distinguished from a continuous conformal layer in that at least a portion of the Group 4B–6B transition metal-containing liner remains exposed after the CVD process. The amount of exposed liner remaining can be varied depending on the geometry of the opening to be filled, the temperature used in the subsequent reflow step, etc. Where the opening to be filled has a very narrow opening width, the amount of exposed liner is preferably greater corresponding to a reduced amount of CVD deposition. The reduced amount of CVD deposition ensures that the opening will not be undesirably blocked before the subsequent PVD metal deposition step. Surprisingly, this reduced coverage CVD layer acts to enhance the filling of the opening in the subsequent reflow step. Preferably, about 50–95% of the liner surface is covered by the CVD deposited metal.

The exact CVD deposition conditions may be varied depending on the degree of coverage and/or amount of deposition desired. An example of typical process conditions would involve a CVD aluminum deposition temperature of about 200° C. for about 2.5 seconds with the other process conditions corresponding to those normally used for CVD of aluminum.

After deposition of the discontinuous layer, the aluminum or aluminum alloy to form the bulk of the conductive structure in the opening is deposited by PVD using conventional PVD techniques. The amount of aluminum deposited is preferably at least an amount sufficient to completely fill the opening (i.e. that the volume of aluminum or aluminum alloy deposited is at least equal to the volume of space in the opening to be filled) more preferably, an excess of aluminum is deposited. The aluminum heater set point in the PVD apparatus is preferably set at about 450° C. or less. The deposition time may vary depending on the desired deposition amount and other process conditions. An example of typical deposition time is about 200–300 seconds, more typically about 250 seconds. Preferably, the wafer or substrate is kept at a temperature of about 400° C. or less in the PVD process.

The reflow of the deposited aluminum or aluminum alloy may occur as a function of heat build-up as the PVD process progresses. Alternatively, a separate reflow heating step may be performed using annealing or other heating techniques known in the art. Generally, the reflow is conducted to eliminate voids in the deposited aluminum or aluminum alloy in a reasonable amount of time while minimizing the exposure of the substrate to high temperatures. Preferably, reflow temperatures above about 550° C. are avoided. The improved wetting characteristics associated with the discontinuous aluminum layer of the invention generally enable the use of less severe reflow conditions to obtain substantially void-free filled structures.

Where an aluminum alloy is used to fill the opening, the alloy preferably contains at least about 90 wt. % aluminum, more preferably at least about 95 wt. % aluminum. Preferred alloying materials are conventional additives such as copper or silicon. In general, the use of substantially pure aluminum is preferred.

The methods of the invention are preferably conducted in a cluster tool at about $10^{-7}$ to $10^{-8}$ torr such that vacuum is maintained between the various steps.

Figure 2:
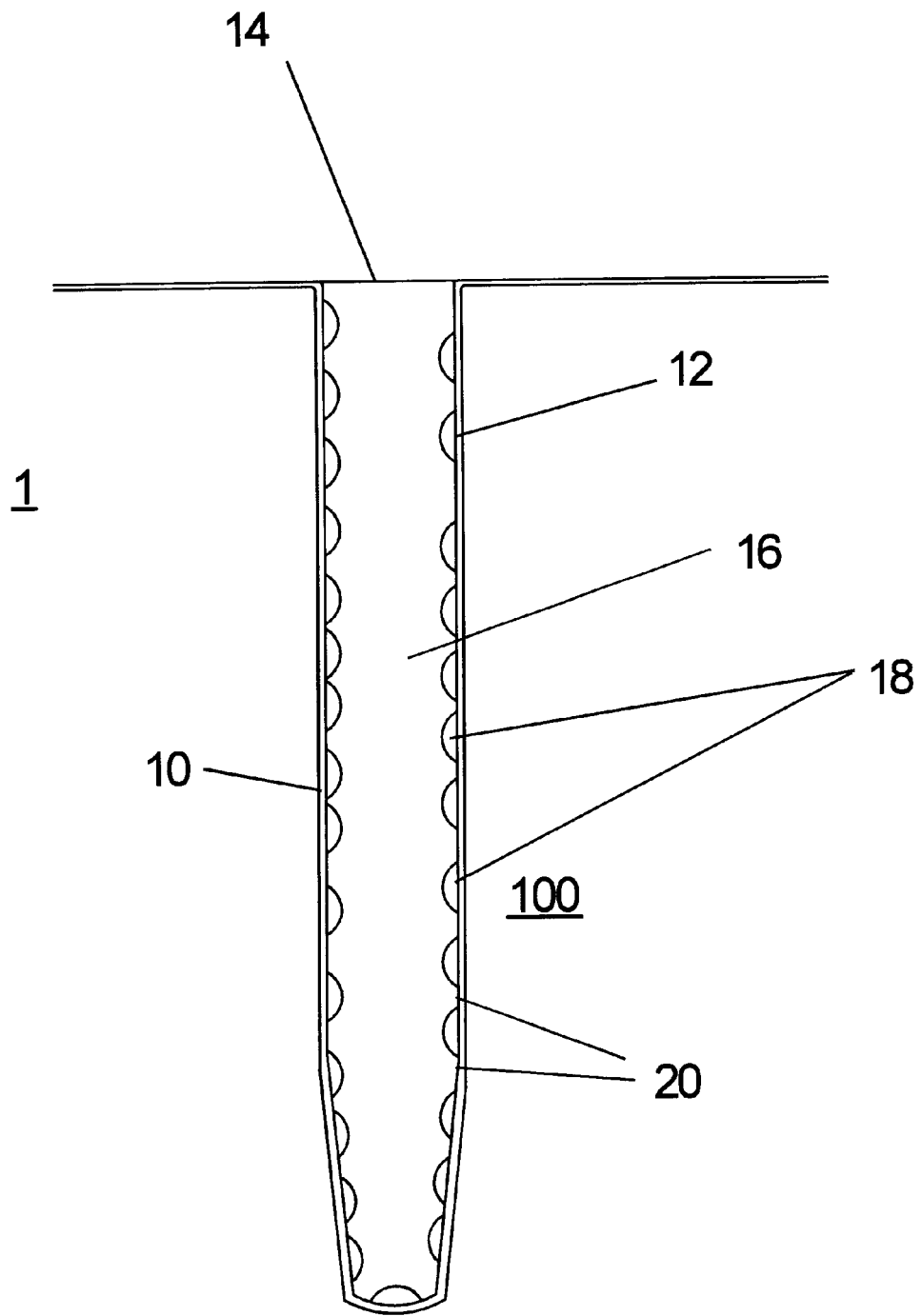
FIG. 2 is a schematic cross section of the substrate having a discontinuous CVD metal layer according to a method of the invention.

FIGS. 1 and 2 are provided to further illustrate the invention. In FIG. 1, a substrate 1 is provided with an opening 100. The opening is lined with a titanium nitride liner 10. The opening has a mouth 14 and interior surface partly defined by walls shown as back wall 16 and side wall 12 in the cross section view. The deposition of the discontinuous layer would result in nuclei 18 on the interior surface schematically illustrated in FIG. 2. It should be noted that the nuclei on back wall 16 have been omitted for clarity of illustration. The discontinuous layer shown in FIG. 2 also shows portions 20 of the TiN layer which remain exposed after the deposition of discontinuous layer 18. In the actual invention, the nuclei formation would typically occur on all the walls (interior surfaces) of the opening including back wall 16. The spacing between the nuclei may range from nuclei completely touching neighboring nuclei to nuclei being completely separate from each other depending in part on the extent of deposition.

The deposition of the PVD metal is not shown.

It should be understood that the invention is not limited to the structure shown in the figures. As noted above, the methods of the invention may be used to fill in any opening commonly formed in the manufacture of integrated circuit devices.

What is claimed is:

1. A method forming a metal-filled structure in an opening on a substrate, the method comprising:
    (a) providing a substrate having an opening with an interior surface,
    (b) depositing a discontinuous metal layer by chemical vapor deposition on the interior surface of the opening, said discontinuous metal layer covering about 50–95% of said interior surface,
    (c) depositing a further amount of metal by physical vapor deposition over the discontinuous layer in the opening, and (d) reflowing the further amount of metal to obtain the metal-filled structure.

2. The method of claim 1 wherein said opening is formed in a dielectric material layer on said substrate.

3. The method of claim 2 wherein said interior surface of the substrate provided in step (a) is lined with a conductive layer of Group 4B–6B transition metal nitride material.

4. The method of claim 3 wherein said conductive layer comprises titanium nitride.

5. The method of claim 1 wherein said opening has a mouth with a width of about 250 nm or less.

6. The method of claim 5 where said mouth has a width of about 200 nm or less.

7. The method of claim 1 wherein steps (b), (c), and (d) are performed at reduced pressure.

8. The method of claim 7 wherein said pressure is about $10^{-7}$ to $10^{-8}$ torr.

9. The method of claim 1 wherein said discontinuous metal layer is formed in step (b) by chemical vapor deposition of aluminum.

10. The method of claim 1 wherein said further amount of metal comprises a metal selected from the group consisting of aluminum and aluminum alloys.

11. The method of claim 10 wherein said further amount of metal is an aluminum alloy comprising an element selected from the group consisting of copper, silicon and mixtures thereof.

12. The method of claim 1 wherein said reflow occurs by heat build-up during said physical vapor deposition step.

13. The method of claim 1 wherein said reflow step comprises annealing said substrate after said physical vapor deposition step.

* * * * *